United States Patent
Cho et al.

(10) Patent No.: US 12,224,766 B2
(45) Date of Patent: Feb. 11, 2025

(54) ANALOG DIGITAL CONVERTER AND METHOD FOR ANALOG TO DIGITAL CONVERTING IN THE ANALOG DIGITAL CONVERTER

(71) Applicant: SAMSUNG ELECTRONICS CO., LTD., Suwon-si (KR)

(72) Inventors: Young Sea Cho, Seongnam-si (KR); Wan Kim, Hwaseong-si (KR); Yong Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 158 days.

(21) Appl. No.: 18/057,969

(22) Filed: Nov. 22, 2022

(65) Prior Publication Data
US 2023/0163778 A1     May 25, 2023

(30) Foreign Application Priority Data

Nov. 25, 2021 (KR) .................. 10-2021-0164213
Feb. 18, 2022 (KR) .................. 10-2022-0021205

(51) Int. Cl.
*H03M 1/38* (2006.01)
*H03M 1/12* (2006.01)
(Continued)

(52) U.S. Cl.
CPC .......... *H03M 1/38* (2013.01); *H03M 1/1245* (2013.01); *H03M 1/0604* (2013.01); *H03M 1/462* (2013.01); *H03M 1/66* (2013.01)

(58) Field of Classification Search
CPC ........ H03M 1/38; H03M 1/1245; H03M 1/66; H03M 1/0604; H03M 1/462
See application file for complete search history.

(56) References Cited

U.S. PATENT DOCUMENTS 7,265,707 B2   9/2007   Mizukami et al.
7,589,659 B2   9/2009   Hurrell
(Continued)

FOREIGN PATENT DOCUMENTS

JP   2018064188    4/2018
JP   2019186842   10/2019
(Continued)

OTHER PUBLICATIONS

Brian P. Ginsburg, et al., "500-MS/s 5-bit ADC in 65-nm CMOS With Split Capacitor Array DAC", IEEE Journal of Solid-State Circuits, vol. 42, No. 4, Apr. 2007.

*Primary Examiner* — Joseph J Lauture
(74) *Attorney, Agent, or Firm* — F. Chau & Associates, LLC (57) ABSTRACT

An analog-to-digital converter is provided. An analog-to-digital converter includes a comparator including a first input node receiving an output of a plurality of first unit capacitors and a second input node receiving an output of a plurality of second unit capacitors, a control logic configured to output first and second control signals on the basis of an output signal of the comparator, and a reference voltage adjustment circuit configured to adjust an output voltage provided to the comparator on the basis of the first and second control signals. The reference voltage adjustment circuit comprises a first pull-up circuit configured to apply a first reference voltage to each of the plurality of first unit capacitors and a first pull-down circuit configured to apply a second reference voltage to each of the plurality of second unit capacitors, based on v.

21 Claims, 6 Drawing Sheets

(51) Int. Cl.
  *H03M 1/06* (2006.01)
  *H03M 1/46* (2006.01)
  *H03M 1/66* (2006.01)

(56) References Cited

U.S. PATENT DOCUMENTS

| | | | |
|---|---|---|---|
| 9,413,379 | B2 | 8/2016 | Kim et al. |
| 10,097,198 | B1 | 10/2018 | Lee et al. |
| 2013/0009796 | A1 | 1/2013 | Sakiyama et al. |
| 2015/0249463 | A1* | 9/2015 | Alladi .................... H03M 1/66 |
| | | | 341/172 |

FOREIGN PATENT DOCUMENTS

| KR | 10-2017-0069140 | 6/2017 |
|---|---|---|
| KR | 10-1746063 | 6/2017 |
| KR | 10-2259734 | 6/2021 |

\* cited by examiner

ANALOG DIGITAL CONVERTER AND METHOD FOR ANALOG TO DIGITAL CONVERTING IN THE ANALOG DIGITAL CONVERTER

This U.S. non-provisional patent application claims priority under 35 U.S.C. 119 to Korean Patent Application No. 10-2021-0164213 filed on Nov. 25, 2021, and Korean Patent Application No. 10-2022-0021205 filed on Feb. 18, 2022 in the Korean Intellectual Property Office, the disclosures of which are incorporated by reference in their entirety herein.

TECHNICAL FIELD

The present disclosure relates to an analog-to-digital converter and a method for analog-to-digital conversion of an analog-to-digital converter.

DISCUSSION OF RELATED ART

Analog signals can be continuous and provide a large number of different voltage or current values. However, digital circuits that process data may operate on binary signals that have two discrete states such as a logic "1" (HIGH) or a logic "0" (LOW). Accordingly, an electronic circuit is needed to convert between the two different domains of continuously changing analog signals and discrete digital signals. An analog-to-digital converter (ADC) may be used to generate a sequence of digital code representing signal levels of an analog signal.

A successive-approximation-register (SAR) analog-to-digital converter (ADC) is a type of analog-to-digital converter that converts a continuous analog waveform into a discrete digital representation (i.e., the sequence of digital code) using a binary search through all possible quantization levels before finally conversing upon a digital output for each conversion.

However, the SAR ADC consumes a great deal of power in the process of converting a signal.

SUMMARY

An object of the present disclosure is to provide an analog-to-digital converter with reduced operational power consumption.

An object of the present disclosure is to provide an analog-to-digital conversion method of an analog-to-digital converter with reduced operational power consumption.

According to an embodiment of the present disclosure, an analog-to-digital converter includes a comparator, a control logic, and a reference voltage adjustment circuit. The comparator includes a first input node receiving an output of a plurality of first unit capacitors and a second input node receiving an output of a plurality of second unit capacitors. The control logic is configured to output first and second control signals on the basis of an output signal of the comparator. The reference voltage adjustment circuit configured is to adjust an output voltage provided to the comparator on the basis of the first and second control signals. The reference voltage adjustment circuit includes a first pull-up circuit configured to apply a first reference voltage to each of the plurality of first unit capacitors and a first pull-down circuit configured to apply a second reference voltage to each of the plurality of second unit capacitors, based on the first and second controls signals.

According to an embodiment of the present disclosure, there is provided an analog-to-digital converter including a first capacitor array, a second capacitor array, and control logic. The first capacitor array includes a plurality of thermometer code-based first unit capacitors used to determine upper bits of a digital output signal corresponding to an analog input signal. The second capacitor array includes a plurality of binary-weighted second unit capacitors used to determine lower bits of the digital output signal. The control logic is configured to receive a reference voltage from the first and second capacitor arrays and output first and second control signals. The first and second capacitor arrays include first and second operation switches configured to apply first and second reference voltages on the basis of the first and second control signals, respectively.

According to an embodiment of the present disclosure, there is provided a method of performing analog-to-digital conversion using an analog-to-digital converter including a comparator including a plurality of nodes to which outputs of a plurality of first unit capacitors and outputs of a plurality of second unit capacitors are connected, a control logic, and a pull-up circuit and a pull-down circuit. The method includes: the control logic outputting first and second control signals on the basis of an output signal of the comparator; and adjusting by the pull-up circuit and the pull-down circuit a reference voltage applied to the plurality of first unit capacitors and the plurality of second unit capacitors on the basis of the first and second control signals. The adjusting includes the pull-up circuit applying a first reference voltage to each of the plurality of first unit capacitors, and the pull-down circuit applying a second reference voltage to each of the plurality of second unit capacitors that is different from the first reference voltage.

The technical objects of the present disclosure are not limited to those described above, and other objects that are not described herein will be apparently understood by those skilled in the art from the following description.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EMBODIMENTS

Hereinafter, embodiments according to the technical spirit of the present disclosure will be described below with reference to the accompanying drawings.

Figure 1:
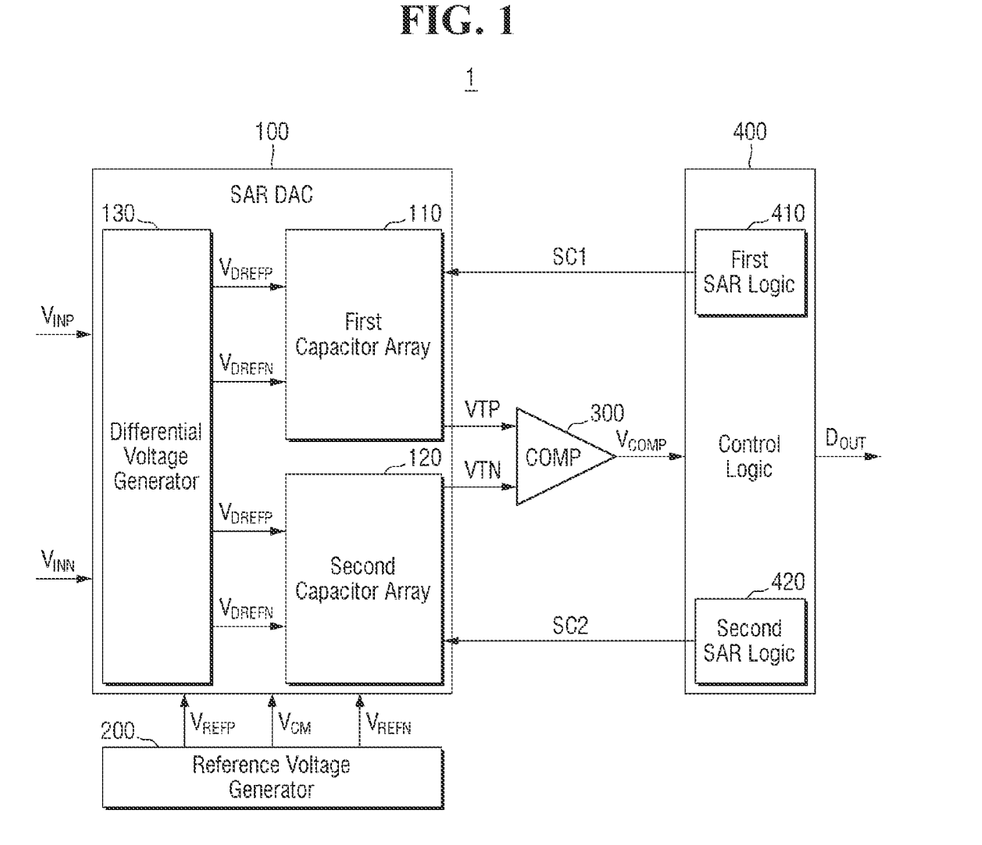
FIG. 1 is a block diagram of a semiconductor device according to an example embodiment of the inventive concept.

FIG. 1 is a block diagram of a semiconductor device according to some embodiments.

Referring to FIG. 1, a semiconductor device 1 may include a successive-approximation-register digital-to-analog converter (SAR DAC) 100, a reference voltage generator 200, a comparator 300 (e.g., a comparison circuit), a first SAR logic 410 (e.g., a first logic circuit), a second SAR logic 420 (e.g., a second logic circuit), and a control logic 400 (e.g., a control logic circuit).

In some embodiments, the semiconductor device 1 may be, for example, an analog-to-digital converter that converts analog input signals $V_{INP}$ and $V_{INN}$ into corresponding digital output signals $D_{OUT}$. In an embodiment, an input signal is output to the SAR DAC using differential signaling using two complementary signals, namely analog input signals $V_{INP}$ and $V_{INN}$. For example, the input signal may be an analog signal sensed by a sensor. In detail, the semiconductor device 1 may be, for example, a successive-approximation-register analog-to-digital converter (SAR ADC) that converts analog input signals $V_{INP}$ and $V_{INN}$ provided through a successive approximation scheme into a digital output signal of q bits (where q is a natural number).

Hereinafter, the technical spirit of the present disclosure will be described by assuming that the semiconductor device 1 is a SAR ADC, but the present disclosure is not limited thereto. In other embodiments, the semiconductor device 1 may be implemented as an analog-to-digital converter other than a SAR ADC or may be implemented as a semiconductor device 1 other than an analog-to-digital converter.

Referring to FIG. 1, the SAR DAC 100 may include a first capacitor array 110, a second capacitor array 120, and a differential reference voltage generator 130.

The SAR DAC 100 may adjust first and second output voltages VTP and VTN provided to the comparator 300 on the basis of first and second control signals SC1 and SC2 received from the control logic 400 which will be described below. When the semiconductor device 1 is a SAR ADC, a reference voltage adjustment circuit may include a digital-to-analog converter (DAC) configured to adjust a reference voltage received from the reference voltage generator 200 according to a digital signal and output the adjusted reference voltage.

The SAR DAC 100 may receive analog input signals $V_{INP}$ and $V_{INN}$. The SAR DAC 100 may sample and hold the analog input signals $V_{INP}$ and $V_{INN}$. The SAR DAC 100 may store the analog input signals $V_{INP}$ and $V_{INN}$ using a predetermined storage device in to provide first and second output voltages VTP and VTN based on the analog input signals $V_{INP}$ and $V_{INN}$ to the comparator 300.

The SAR DAC 100 may receive a first reference voltage $V_{REFP}$, a common mode voltage $W_{CM}$, and a second reference voltage $V_{REFN}$ from the reference voltage generator 200. The common mode voltage $W_{CM}$ may be, for example, an intermediate value between the first reference voltage $V_{REFP}$ and the second reference voltage $V_{REFN}$. In an embodiment, the first reference voltage $V_{REFP}$ is larger than the second reference voltage $V_{REFN}$.

The differential reference voltage generator 130 may generate a first differential reference voltage $V_{DREFP}$ obtained by dividing the first reference voltage $V_{REFP}$ and a second differential reference voltage $V_{DREFN}$ obtained by dividing the second reference voltage $V_{REFN}$.

A first input node of the comparator 300 may be connected to an output of the SAR DAC 100 to receive the first output voltage VTP from the first capacitor array 110. The first capacitor array 110 may include a plurality of unit capacitors. A second input node of the comparator 300 may be connected to an output of the SAR DAC 100 to receive a second output voltage VTN from the second capacitor array 120. The second capacitor array 120 may include a plurality of unit capacitors.

The comparator 300 may compare the first output voltage VTP of the first capacitor array 110 and the second output voltage VTN of the second capacitor array 120 to generate and output a comparison signal $V_{COMP}$. When the first output voltage VTP is higher than the second output voltage VTN, the comparator 300 may output a comparison signal $V_{COMP}$ having a first level. When the first output voltage VTP is lower than the second output voltage VTN, the comparator 300 may output a comparison signal $V_{COMP}$ having a second level different from the first level.

The control logic 400 may include a first SAR logic 410 and a second SAR logic 420. Although not specifically shown, the first SAR logic 410 and the second SAR logic 420 may be operated by a control signal provided from the control logic 400. The first SAR logic 410 and the second SAR logic 420 may receive a comparison signal $V_{COMP}$ from the comparator 300 and may determine bits of the digital output signal $D_{OUT}$ corresponding to the analog input signals $V_{INP}$ and $V_{INN}$ on the basis of the received comparison signal $V_{COMP}$. For example, the control logic 400 could interpret a value of the analog input signal to be a logic high when the comparison signal $V_{COMP}$ has the first level and to be a logic low when the comparison signal $V_{COMP}$ has the second level.

The first SAR logic 410 may output a first control signal SC1 to the first capacitor array 110 on the basis of the comparison signal $V_{COMP}$. The second SAR logic 420 may output a second control signal SC2 to the second capacitor array 120 on the basis of the comparison signal $V_{COMP}$.

Although the first SAR logic 410 and the second SAR logic 420 are illustrated as separate logics in the drawing, the present disclosure is not limited thereto. It will be appreciated that the first SAR logic 410 and the second SAR logic 420 may be implemented as a single logic circuit.

The SAR DAC 100 may adjust the first output voltage VTP provided to the comparator 300 on the basis of the first control signal SC1. The SAR DAC 100 may adjust the second output voltage VTN provided to the comparator 300 on the basis of the second control signal SC2. Specifically, the SAR DAC 100 may adjust the levels of the first output voltage VTP and the second output voltage VTN provided to the comparator 300 according to the first control signal SC1 and the second control signal SC2. The SAR DAC 100 may control a plurality of unit capacitors and a plurality of switches included in the first capacitor array 110 according to the first control signal SC1 to generate the first output voltage VTP and may output the first output voltage VTP to the comparator 300. Also, the SAR DAC 100 may control a plurality of unit capacitors and a plurality of switches included in the second capacitor array 120 according to the second control signal SC2 to generate the second output voltage VTN and may output the second output voltage VTN to the comparator 300.

The control logic 400 controls the operation of the first SAR logic 410 and the operation of the second SAR logic 420. For example, the control logic 400 may control the operation timing of the first SAR logic 410 and the second SAR logic 420.

In an embodiment, the control logic 400 merges bits determined in the first SAR logic 410 and the second SAR logic 420 to generate the digital output signal $D_{our}$ and outputs the digital output signal $D_{OUT}$.

Figure 2:
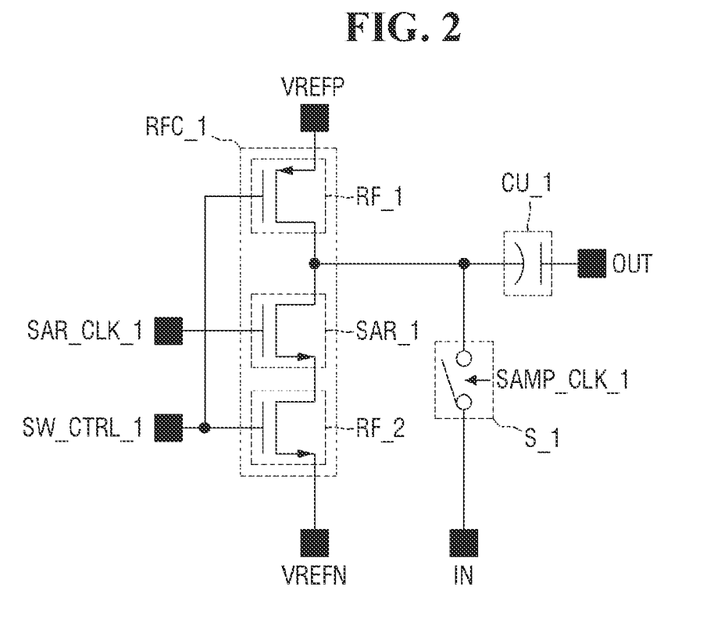
FIG. 2 is an exemplary circuit diagram of a pull-up circuit included in the reference voltage adjustment circuit of FIG. 1 according to an example embodiment of the inventive concept.
Figure 3:
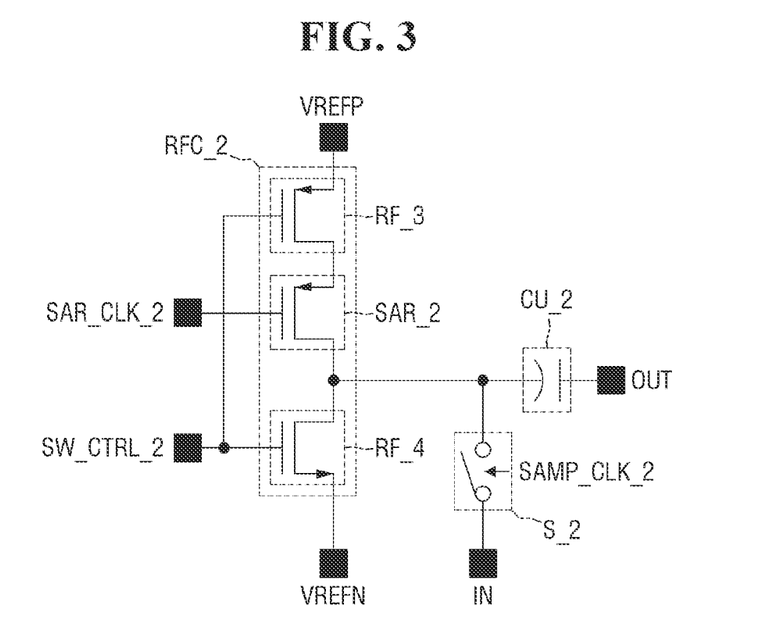
FIG. 3 is an exemplary circuit diagram of a pull-down circuit included in the reference voltage adjustment circuit of FIG. 1 according to an example embodiment of the inventive concept.
Figure 4:
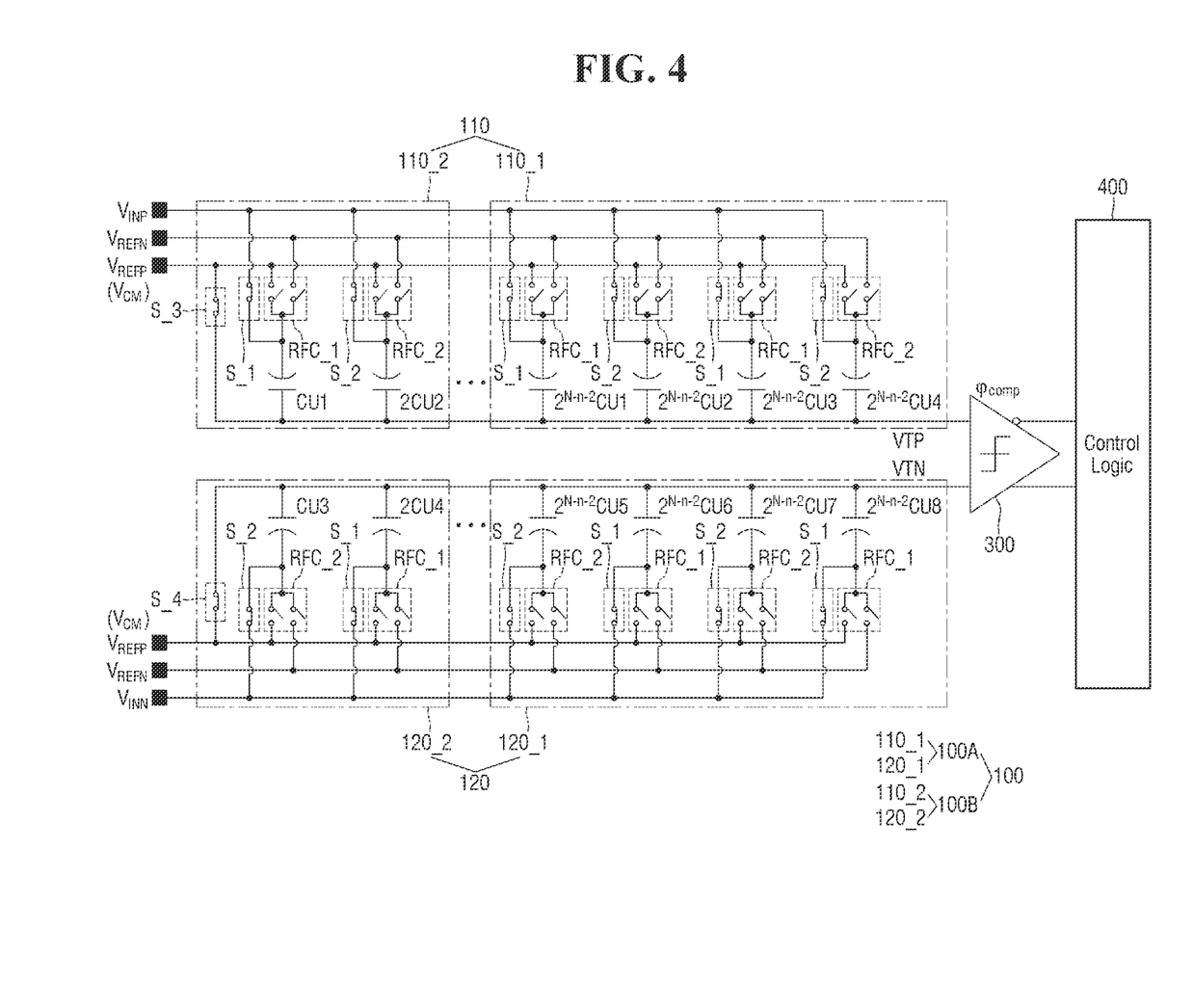
FIG. 4 is a diagram illustrating an operation in a sampling phase of the reference voltage adjustment circuit of FIG. 1 according to an example embodiment of the inventive concept.
Figure 5:
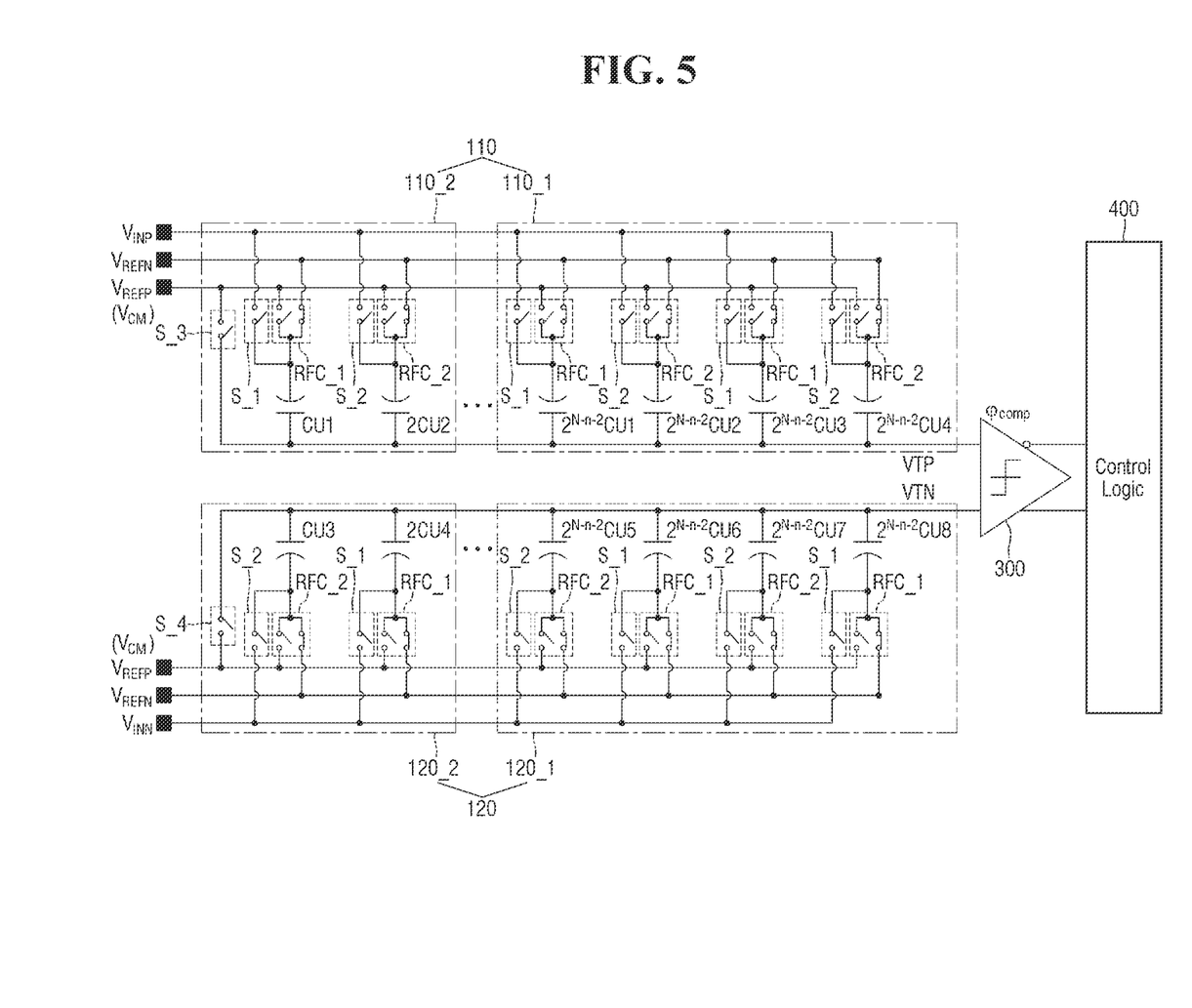
FIG. 5 is a diagram illustrating an operation in a conversion phase of the reference voltage adjustment circuit of FIG. 1 according to an example embodiment of the inventive concept.

FIG. 2 is an exemplary circuit diagram of a pull-up circuit included in the reference voltage adjustment circuit of FIG. 1. FIG. 3 is an exemplary circuit diagram of a pull-down circuit included in the reference voltage adjustment circuit of FIG. 1. FIG. 4 is a diagram illustrating an operation in a sampling phase of the reference voltage adjustment circuit of FIG. 1. FIG. 5 is a diagram illustrating an operation in a conversion phase of the reference voltage adjustment circuit of FIG. 1.

Referring to FIGS. 1, 4 and 5, the SAR DAC 100 may include a first capacitor array 110 including a plurality of first unit capacitors $2^{N-n-2}$CU1, $2^{N-n-2}$CU2, $2^{N-n-2}$CU3, $2^{N-n-2}$CU4, CU1, and 2CU2 and a second capacitor array 120 including a plurality of second unit capacitors $2^{N-n-2}$CU5, $2^{N-n-2}$CU6, $2^{N-n-2}$CU7, $2^{N-n-2}$CU8, CU3, and 2CU4. In some embodiments, the number of unit capacitors is not limited to those shown in FIGS. 4 and 5. Here, N denotes a total number of bits, and n denotes a number of bits in a binary-weighted capacitor array.

The SAR DAC 100 may include a first-A capacitor array 100A including a plurality of thermometer code-based unit capacitors and a first-B capacitor array 100B including a plurality of unit capacitors having a binary weight structure.

The first capacitor array 110 may include a first_1 capacitor array 110_1 including a plurality of thermometer code-based unit capacitors and a first_2 capacitor array 110_2 including a plurality of binary-weighted unit capacitors. The second capacitor array 120 may include a second_1 capacitor array 120_1 including a plurality of thermometer code-based unit capacitors and a second_2 capacitor array 120_2 including a plurality of binary-weighted unit capacitors.

The first-A capacitor array 100A including the plurality of thermometer code-based unit capacitors may be used to determine higher N−n bits of a digital output signal corresponding to a provided analog input signal. The first-B capacitor array 100B including the plurality of binary-weighted unit capacitors may be used to determine n lower bits of a digital output signal.

A plurality of first lower unit capacitors CU1 and 2CU2 and a plurality of second lower unit capacitors CU3 and 2CU4 may each have a capacitance that is $2^n$ times the capacitance of the unit capacitor. For example, the plurality of first lower unit capacitors CU1 and 2CU2 and the plurality of second lower unit capacitors CU3 and 2CU4 may each have a capacitance that is $2^0$ times or $2^1$ times the capacitance of the unit capacitor. That is, the capacitance of the plurality of first lower unit capacitors CU1 and 2CU2 and the plurality of second lower unit capacitors CU3 and 2CU4 may have a binary weight structure.

A plurality of first upper unit capacitors $2^{N-n-2}$CU1, $2^{N-n-2}$CU2, $2^{N-n-2}$CU3, $2^{N-n-2}$CU4, and a plurality of second upper unit capacitors $2^{N-n-2}$CU5, $2^{N-n-2}$CU6, $2^{N-n-2}$CU7, and $2^{N-n-2}$CU8 may each have a capacitance that is $2^{N-n-2}$ times the capacitance of the unit capacitor. In this case, the plurality of first upper unit capacitors $2^{N-n-2}$CU1, $2^{N-n-2}$CU2, $2^{N-n-2}$CU3, and $2^{N-n-2}$CU4 and the plurality of second upper unit capacitors $2^{N-n-2}$CU5, $2^{N-n-2}$CU6, $2^{N-n-2}$CU7, and $2^{N-n-2}$CU8 may each have a structure of a plurality of thermometer code-based unit capacitors.

The plurality of first upper unit capacitors $2^{N-n-2}$CU1, $2^{N-n-2}$CU2, $2^{N-n-2}$CU3, and $2^{N-n-2}$CU4 and the plurality of second upper unit capacitors $2^{N-n-2}$CU5, $2^{N-n-2}$CU6, $2^{N-n-2}$CU7, and $2^{N-n-2}$CU8 may be used to receive a common mode voltage $W_{CM}$, a first reference voltage $V_{REFP}$, and a second reference voltage $V_{REFN}$ and determine upper bits of a digital output signal $D_{OUT}$.

The plurality of first lower unit capacitors CU1 and 2CU2 and the plurality of second lower unit capacitors CU3 and 2CU4 may be used to receive a common mode voltage $W_{CM}$, a first reference voltage $V_{REFP}$, and a second reference voltage $V_{REFN}$ and determine lower bits of a digital output signal $D_{OUT}$.

The first capacitor array 110 may include the plurality of first upper unit capacitors $2^{N-n-2}$CU1, $2^{N-n-2}$CU2, $2^{N-n-2}$CU3, and $2^{N-n-2}$CU4 and the plurality of first lower unit capacitors CU1 and 2CU2. A first terminal of each of the plurality of first upper unit capacitors $2^{N-n-2}$CU1, $2^{N-n-2}$CU2, $2^{N-n-2}$CU3, and $2^{N-n-2}$CU4 and the plurality of first lower unit capacitors CU1 and 2CU2 may be connected to a first input node of the comparator 300. The second capacitor array 120 may include the plurality of second upper unit capacitors $2^{N-n-2}$CU5, $2^{N-n-2}$CU6, $2^{N-n-2}$CU7, and $2^{N-n-2}$CU8 and the plurality of second lower unit capacitors CU3 and 2CU4. A first terminal of each of the plurality of second upper unit capacitors $2^{N-n-2}$CU5, $2^{N-n-2}$CU6, $2^{N-n-2}$CU7, and $2^{N-n-2}$CU8 and the plurality of second lower unit capacitors CU3 and 2CU4 may be connected to a second input node of the comparator 300.

For example, the first terminal may refer to a top plate of a capacitor, and the second terminal may refer to a bottom plate thereof.

The second terminal of each of the plurality of first upper unit capacitors $2^{N-n-2}$CU1, $2^{N-n-2}$CU2, $2^{N-n-2}$CU3, and $2^{N-n-2}$CU4 and the plurality of second upper unit capacitors $2^{N-n-2}$CU5, $2^{N-n-2}$CU6, $2^{1-2}$CU7, and $2^{N-n-2}$CU8 may be connected to one of a node receiving the analog input signal $V_{INN}$, a node receiving the analog input signal $V_{INP}$, a node receiving the first reference voltage $V_{REFP}$, and a node receiving the second reference voltage $V_{REFN}$ by a plurality of switches S_1, RFC_1, S_2, and RFC_2.

The second terminal of each of the plurality of first lower unit capacitors CU1 and 2CU2 and the plurality of second lower unit capacitors CU3 and 2CU4 may be connected to one of a node receiving the analog input signal $V_{INN}$, a node receiving the analog input signal $V_{INP}$, a node receiving the first reference voltage $V_{REFP}$, and a node receiving the second reference voltage $V_{REFN}$ by the plurality of switches S_1, RFC_1, S_2, and RFC_2.

A third sampling switch S_3 may be connected between the first input node of the comparator 300 and the plurality of unit cells included in the first capacitor array 110. A fourth sampling switch S_4 may be connected between the second input node of the comparator 300 and the plurality of unit cells included in the second capacitor array 120.

In an embodiment, a unit cell refers to a cell including a pull-up circuit or a pull-down circuit, which will be described below. In this case, referring to FIGS. 2 to 5, the pull-up circuit may include a first unit capacitor CU_1, a first sampling switch S_1, and a first reference voltage adjustment switch RFC_1. Referring to FIG. 2, the first reference voltage adjustment switch RFC_1 may include first and second reference voltage switches RF_1 and RF_2 and a first SAR operation switch SAR_1.

Referring to FIG. 3, the pull-down circuit may include a second unit capacitor CU_2, a second sampling switch S_2, and a second reference voltage adjustment switch RFC_2. The second reference voltage adjustment switch RFC_2 may include third and fourth reference voltage switches RF_3 and RF_4 and a second SAR operation switch SAR_2.

In this case, the first and second unit capacitors CU_1 and CU_2 of FIGS. 2 and 3 may correspond to one of the plurality of unit capacitors CU1, 2CU2, CU3, 2CU4, $2^{N-n-2}$CU1, $2^{N-n-2}$CU2, $2^{N-n-2}$CU3, $2^{N-n-2}$CU4, $2^{N-n-2}$CU5, $2^{N-n-2}$CU6, $2^{N-n-2}$CU7, and $2^{N-n-2}$CU8 of FIGS. 4 and 5. Specific details thereof will be described below.

The first terminals of the plurality of unit capacitors CU1, 2CU2, $2^{N-n-2}$CU1, $2^{N-n-2}$CU2, $2^{N-n-2}$CU3, and $2^{N-n-2}$CU4 included in the first capacitor array 110 may be connected to a node receiving the first reference voltage $V_{REFP}$ by the third sampling switch S_3. The first terminals of the plurality of unit capacitors CU3, 2CU4, $2^{N-n-2}$CU5, $2^{N-n-2}$CU6, $2^{N-n-2}$CU7, and $2^{N-n-2}$CU8 included in the second capacitor array 120 may be connected to a node receiving the first reference voltage $V_{REFP}$ by the fourth sampling switch S_4.

However, the technical spirit of the present disclosure is not limited thereto, and the first terminals may be connected to a node receiving a voltage different from the first reference voltage $V_{REFP}$, e.g., the common mode voltage $V_{CM}$, by the third and fourth sampling switches S_3 and S_4. The third and fourth sampling switches S_3 and S_4 may be controlled by the first control signal SC1 and the second control signal SC2 output from the first SAR logic 410 and the second SAR logic 420.

Referring to FIG. 2, the SAR DAC 100 may include a first pull-up circuit for applying the first reference voltage $V_{REFP}$ to the first unit capacitor CU_1 on the basis of a first switch control signal SW_CTRL_1. The first switch control signal SW_CTRL_1 may be a signal received from the control logic 400.

The first pull-up circuit may include a first sampling switch Si configured to receive the first input signals $V_{INP}$ and $V_{INN}$, first and second reference voltage switches RF_1 and RF_2 configured to receive the first switch control signal SW_CTRL_1 and apply the first and second reference voltages $V_{REFP}$ and $V_{REFN}$, and a first SAR operation switch SAR_1 disposed between the first and second reference voltage switches RF_1 and RF_2. For example, when the first and second reference voltage switches RF_1 and RF_2 are implemented by a transistor, the first switch control signal SW_CTRL_1 may be applied to a gate terminal of the transistor.

In some embodiments, the first pull-up circuit may refer to a circuit in which a resistance component is disposed closer to a power supply voltage than to a ground voltage. In this case, although not specifically illustrated, the ground voltage may correspond to the second reference voltage $V_{REFN}$, and the power supply voltage may be correspond to the first reference voltage $V_{REFP}$.

The first sampling switch Si may function as a bootstrap switch. In this case, a change in the on-resistance of the sampling switch, which is dependent on the input signals $V_{INP}$ and $V_{INN}$, may be made constant.

Referring to FIGS. 2 and 4, when a sampling operation is performed, the third sampling switch S_3 may be turned on, and then the first sampling switch Si may be turned on by receiving a first signal of a first sampling clock signal SAMP_CLK_1, i.e., an operation signal.

For example, when the first sampling switch Si is implemented by a transistor, the first sampling clock signal SAMP_CLK_1 may be applied to a gate terminal of the transistor. Subsequently, the first SAR operation switch SAR_1 may be turned off by receiving a first signal of the first SAR clock signal SAR_CLK_1. For example, when the first SAR operation switch SAR_1 is implemented by a transistor, the first SAR clock signal SAR_CLK_1 may be applied to a gate terminal of the transistor. Subsequently, the first reference voltage switch RF_1 may be turned off by receiving a first signal of the first switch control signal SW_CTRL_1, and thus the first input signals $V_{INP}$ and $V_{INN}$ may be sampled in the first unit capacitor CU_1 of the first pull-up circuit. For example, when the first reference voltage switch RF_1 is implemented by a transistor, the first switch control signal SW_CTRL_1 may be applied to a gate terminal of the transistor. In an embodiment, the first sampling clock signal SAMP_CLK_1, the first SAR clock signal SAR_CLK_1, and the first switch control signal SW_CTRL_1 is generated based on the first control signal SC1.

Referring to FIGS. 2 and 5, when a conversion operation is performed, the third sampling switch S_3 may be turned off, and then the first sampling switch Si may be turned off by receiving a second signal of the first sampling clock signal SAMP_CLK_1. Subsequently, the first SAR operation switch SAR_1 may be turned on by receiving a second signal of the first SAR clock signal SAR_CLK_1, i.e., an operation signal. Subsequently, one of the first and second reference voltage switches RF_1 and RF_2 may be turned on by receiving a second signal of the first switch control signal SW_CTRL_1, and thus the first reference voltage $V_{REFP}$ may be applied to the first unit capacitor CU_1 of the first pull-up circuit. Specifically, by receiving the second signal of the first switch control signal SW_CTRL_1, the first reference voltage switch RF_1 may be turned on, and the second reference voltage switch RF_2 may be turned off. Thus, the first reference voltage $V_{REFP}$ may be applied to the first unit capacitor CU_1 of the first pull-up circuit.

In this case, while the first input signals $V_{INP}$ and $V_{INN}$ are being applied to the first unit capacitor CU_1 of the first pull-up circuit, neither of the first and second reference voltages $V_{REFP}$ and $V_{REFN}$ are applied. Also, while the first input signals $V_{INP}$ and $V_{INN}$ are being applied to the first unit capacitor CU_1, only one of the first and second reference voltages $V_{REFP}$ and $V_{REFN}$ are applied.

That is, by the operation of the first SAR operation switch SAR_1 and the operations of the first and second reference voltage switches RF_1 and RF_2 being controlled by the first SAR clock signal SAR_CLK_1 and the first switch control signal SW_CTRL_1 in the first pull-up circuit, the first reference voltage $V_{REFP}$ may be applied to the first unit capacitor CU_1.

Referring to FIG. 3, the SAR DAC 100 may include a first pull-down circuit for applying the second reference voltage $V_{REFN}$ to the second unit capacitor CU_2 on the basis of a second switch control signal SW_CTRL_2. The second switch control signal SW_CTRL_2 may be a signal received from the control logic 400.

The first pull-down circuit may include a second sampling switch S_2 configured to receive the second input signals $V_{INP}$ and $V_{INN}$, third and fourth reference voltage switches RF_3 and RF_4 configured to receive the second switch control signal SW_CTRL_2 and apply the first and second reference voltages $V_{REFP}$ and $V_{REFN}$, and a second SAR operation switch SAR_2 disposed between the third and fourth reference voltage switches RF_3 and RF_4.

In some embodiments, the first pull-down circuit may refer to a circuit in which a resistance component is disposed closer to a ground voltage than to a power supply voltage. In this case, although not specifically illustrated, the ground voltage may correspond to the second reference voltage $V_{REFN}$, and the power supply voltage may correspond to the first reference voltage $V_{REFP}$.

The second sampling switch S_2 may function as a bootstrap switch. In this case, a change in the on-resistance of the sampling switch, which is dependent on the input signals $V_{INP}$ and $V_{INN}$, may be made constant.

Referring to FIGS. 3 and 4, when a sampling operation is performed, the fourth sampling switch S_4 may be turned on, and then the second sampling switch S_2 may be turned on by receiving a first signal of a second sampling clock signal SAMP_CLK_2, i.e., an operation signal. Subsequently, the second SAR operation switch SAR_2 may be turned off by receiving a first signal of the second SAR clock signal SAR_CLK_2. Subsequently, the fourth reference voltage switch RF_4 may be turned off by receiving a first signal of the second switch control signal SW_CTRL_2, and thus the second input signals $V_{INP}$ and $V_{INN}$ may be sampled in the second unit capacitor CU_2 of the first pull-down circuit.

Referring to FIGS. 3 and 5, when a conversion operation is performed, the fourth sampling switch S_4 may be turned off, and then the second sampling switch S_2 may be turned off by receiving a second signal of the second sampling clock signal SAMP_CLK_2. In an embodiment, the second sampling clock signal SAMP_CLK_2, the second SAR clock signal SAR_CLK_2, and the second switch control signal SW_CTRL_2 is generated based on the first control signal SC1. Subsequently, the second SAR operation switch SAR_2 may be turned on by receiving a second signal of the second SAR clock signal SAR_CLK_2, i.e., an operation signal. Subsequently, one of the third and fourth reference voltage switches RF_3 and RF_4 may be turned on by receiving a second signal of the second switch control signal SW_CTRL_2, and thus the second reference voltage $V_{REFN}$ may be applied to the second unit capacitor CU_2 of the first pull-down circuit. Specifically, by receiving the second signal of the second switch control signal SW_CTRL_2, the fourth reference voltage switch RF_4 may be turned on, and the third reference voltage switch RF_3 may be turned off. Thus, the second reference voltage $V_{REFN}$ may be applied to the second unit capacitor CU_2 of the first pull-down circuit.

In this case, while the second input signals $V_{INT}$ and $V_{INN}$ are being applied to the second unit capacitor CU_2 of the first pull-down circuit, neither of the first and second reference voltages $V_{REFP}$ and $V_{REFN}$ are applied. Also, while the second input signals $V_{INP}$ and $V_{INN}$ are being applied to the second unit capacitor CU_2, only one of the first and second reference voltages $V_{REFP}$ and $V_{REFN}$ is applied.

That is, by the operation of the second SAR operation switch SAR_2 and the operations of the third and fourth reference voltage switches RF_3 and RF_4 being controlled by the second SAR clock signal SAR_CLK_2 and the second switch control signal SW_CTRL_2 in the first pull-down circuit, the second reference voltage $V_{REFP}$ may be applied to the second unit capacitor CU_2.

Referring to FIGS. 4 and 5, the first pull-up circuit configured to apply the first reference voltage $V_{REFP}$ and the first pull-down circuit configured to apply the second reference voltage $V_{REFN}$ may be alternately disposed. In an embodiment, the first reference voltage $V_{REFP}$ is a positive voltage, and the second reference voltage $V_{REFN}$ is a negative voltage. However, the technical spirit of the present disclosure is not limited thereto. The first pull-up circuit and the first pull-down circuit included in the first capacitor array 110 may provide a first output voltage VTP to the comparator 300.

Also, the SAR DAC 100 may further include a second pull-up circuit and a second pull-down circuit configured to provide a second output voltage VTN, which is equal in magnitude but opposite in sign to the first output voltage VTP. The second pull-up circuit and the second pull-down circuit included in the second capacitor array 120 may be alternately disposed.

With the split-capacitor switching scheme according to some embodiments, the first reference voltage $V_{REFP}$ may be applied to one region obtained by dividing the capacitance of the capacitor 2n-1C in half, and the second reference voltage $V_{REFN}$ may be applied to the other region. As a result, the same effect as in the case of passively applying the common mode voltage $W_{CM}$ can be obtained. Also, when the conversion operation is sequentially performed from the most significant bit to the least significant bit, it is possible to minimize the power consumed by switching by making a change in reference voltage based on the first or second reference voltages $V_{REFP}$ and $V_{REFN}$ rather than based on the common mode voltage. That is, with the split-capacitor switching scheme according to some embodiments, it is possible to minimize the power consumed by switching by reducing the size of the capacitor to ½ and reducing the change in voltage to ¼ compared to the related art. Also, by not using a conventional logic circuit for adjusting the reference voltage, it is possible to further reduce the dynamic power consumed due to an increase in the number of digital logics and switches.

Figure 6:
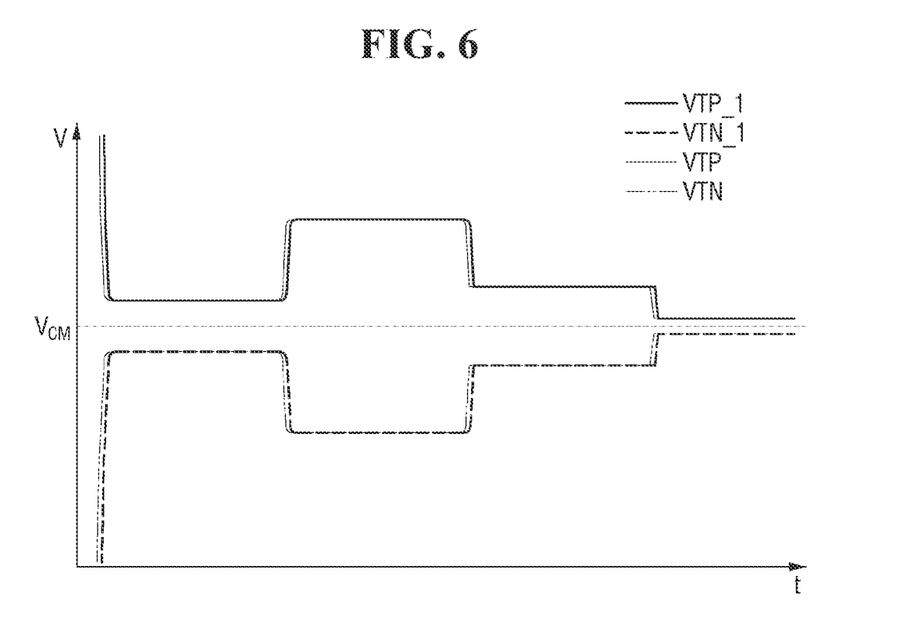
FIG. 6 is a diagram for describing an effect of a semiconductor device according to some embodiments.

The comparator 300 may compare the first output voltage VTP and the second output voltage VTN to perform an operation of approximating the switching operation to digital values. Referring to FIG. 6, the first output voltage VTP and the second output voltage VTN denote graphs indicating the switching operation according to some embodiments, and a first_1 output voltage VTP_1 and a secondi output voltage VTN_1 denote graphs indicating the conventional switching operation that does not use a pull-up circuit and a pull-down circuit. In this case, it can be seen that the time required to determine one bit is shorter than that when the conventional switching scheme is used. That is, since the reference voltage can be applied more quickly than in the related art, it is possible to reduce dynamic power consumption.

Although exemplary embodiments of the present disclosure have been described above with reference to the accompanying drawings, the present disclosure is not limited to the above embodiments and may be implemented in a variety of different forms. Also, those skilled in the art will appreciate that various modifications and alterations may be made therein without departing from the spirit of the present disclosure. Therefore, the above embodiments are to be regarded as illustrative rather than restrictive.

What is claimed is:
1. An analog-to-digital converter comprising:
   a comparator including a first input node receiving an output of a plurality of first unit capacitors and a second input node receiving an output of a plurality of second unit capacitors;
   a control logic configured to output first and second control signals on the basis of an output signal of the comparator; and
   a reference voltage adjustment circuit configured to adjust an output voltage provided to the comparator on the basis of the first and second control signals, wherein the reference voltage adjustment circuit comprises a first pull-up circuit configured to apply a first reference voltage to each of the plurality of first unit capacitors and a first pull-down circuit configured to apply a second reference voltage to each of the plurality of second unit capacitors, based on the first and second controls signals.
2. The analog-to-digital converter of claim 1, wherein the first pull-up circuit comprises a first sampling switch configured to receive a first input signal, first and second reference voltage switches configured to receive the first control signal and apply first and second reference voltages, and a first successive-approximation-register (SAR) operation switch disposed between the first and second reference voltage switches.

3. The analog-to-digital converter of claim 2, wherein when a sampling operation is performed, the first sampling switch is turned on by receiving a first sampling operation clock signal, the first SAR operation switch is turned off by receiving a first SAR clock signal, and the first reference voltage switch is turned off by receiving the first control signal such that the first input signal is sampled in a first unit capacitor of the first pull-up circuit.

4. The analog-to-digital converter of claim 3, wherein the first pull-down circuit comprises a second sampling switch configured to receive a second input signal, third and fourth reference voltage switches configured to receive the second control signal and apply first and second reference voltages, and a second SAR operation switch disposed between the third and fourth reference voltage switches.

5. The analog-to-digital converter of claim 4, wherein when a sampling operation is performed, the second sampling switch is turned on by receiving a second sampling operation clock signal, the second SAR operation switch is turned off by receiving a second SAR clock signal, and the fourth reference voltage switch is turned off by receiving the second control signal such that the second input signal is sampled in a second unit capacitor of the first pull-down circuit.

6. The analog-to-digital converter of claim 4, wherein when a conversion operation is performed, the second sampling switch is turned off, the second SAR operation switch is turned on by receiving a second SAR operation clock signal, and one of the third and fourth reference voltage switches is turned on by receiving the second control signal such that the second reference voltage is applied to a second unit capacitor of the first pull-down circuit.

7. The analog-to-digital converter of claim 2, wherein when a conversion operation is performed, the first sampling switch is turned off, the first SAR operation switch is turned on by receiving a first SAR operation clock signal, and one of the first and second reference voltage switches is turned on by receiving the first control signal such that the first reference voltage is applied to a first unit capacitor of the first pull-up circuit.

8. The analog-to-digital converter of claim 1, wherein neither of the first and second reference voltages is applied while a first input signal is being input to a first unit capacitor of the first pull-up circuit, and only one of the first and second reference voltages is applied while the first input signal is being input to the first unit capacitor.

9. The analog-to-digital converter of claim 8, wherein neither of the first and second reference voltages is applied while a second input signal is being input to a second unit capacitor of the first pull-down circuit, and only one of the first and second reference voltages is applied while the second input signal is being input to the second unit capacitor.

10. The analog-to-digital converter of claim 1, wherein the first pull-up circuit and the first pull-down circuit provide a first output voltage to the comparator, and the first pull-up circuit and the first pull-down circuit are alternately disposed.

11. The analog-to-digital converter of claim 10, wherein the reference voltage adjustment circuit further comprises a second pull-up circuit and a second pull-down circuit that provide a second output voltage, which is equal in magnitude but opposite in sign to the first output voltage, to the comparator, and the second pull-up circuit and the second pull-down circuit are alternately disposed.

12. The analog-to-digital converter of claim 1, wherein the reference voltage adjustment circuit comprises a first capacitor array including a plurality of binary-weighted unit capacitors and a second capacitor array including a plurality of thermometer code-based unit capacitors.

13. An analog-to-digital converter comprising:
a first capacitor array including a plurality of thermometer code-based first unit capacitors used to determine upper bits of a digital output signal corresponding to an analog input signal;
a second capacitor array including a plurality of binary-weighted second unit capacitors used to determine lower bits of the digital output signal; and
a control logic configured to receive a reference voltage from the first and second capacitor arrays to output first and second control signals,
wherein the first and second capacitor arrays comprise first and second operation switches configured to apply first and second reference voltages on the basis of the first and second control signals, respectively.

14. The analog-to-digital converter of claim 13, wherein the first operation switch comprises a first sampling switch configured to receive a first input signal, first and second reference voltage switches configured to receive the first control signal and apply first and second reference voltages, and a first successive-approximation-register (SAR) operation switch disposed between the first and second reference voltage switches, and
when a sampling operation is performed, the first sampling switch is turned on by receiving a first sampling operation clock signal, the first SAR operation switch is turned off by receiving a first SAR clock signal, and the first reference voltage switch is turned off by receiving the first control signal such that the first input signal is sampled in a first unit capacitor connected to the first operation switch.

15. The analog-to-digital converter of claim 14, wherein when a conversion operation is performed, the first sampling switch is turned off, the first SAR operation switch is turned on by receiving a first SAR operation clock signal, and one of the first and second reference voltage switches is turned on by receiving the first control signal such that the first reference voltage is applied to a first unit capacitor connected to the first operation switch.

16. The analog-to-digital converter of claim 13, wherein the second operation switch comprises a second sampling switch configured to receive a second input signal, third and fourth reference voltage switches configured to receive the second control signal and apply first and second reference voltages, and a second SAR operation switch disposed between the third and fourth reference voltage switches, and
when a sampling operation is performed, the second sampling switch is turned on by receiving a second sampling operation clock signal, the second SAR operation switch is turned off by receiving a second SAR clock signal, and the fourth reference voltage switch is turned off by receiving the second control signal such that the second input signal is sampled in a second unit capacitor connected to the second operation switch.

17. The analog-to-digital converter of claim 16, wherein when a conversion operation is performed, the second sampling switch is turned off, the second SAR operation switch is turned on by receiving a second SAR operation clock signal, and one of the third and fourth reference voltage switches is turned on by receiving the second control signal such that the second reference voltage is applied to a second unit capacitor connected to the second operation switch.

18. The analog-to-digital converter of claim 13, wherein each operation switch comprises a pair of switches configured to receive a corresponding one of the control signals and apply the first and second reference voltages, and a switch disposed between the pair that is controlled by a clock signal.

19. A method of performing analog-to-digital conversion using an analog-to-digital converter including a comparator including a plurality of nodes to which outputs of a plurality of first unit capacitors and outputs of a plurality of second unit capacitors are connected, a control logic, a pull-up circuit and a pull-down circuit, the method comprising:
  outputting, by the control logic, first and second control signals on the basis of an output signal of the comparator; and adjusting, by the pull-up circuit and the pull-down circuit a reference voltage applied to the plurality of first unit capacitors and the plurality of second unit capacitors on the basis of the first and second control signals,
  wherein the adjusting comprises the pull-up circuit applying a first reference voltage to each of the plurality of first unit capacitors, and the pull-down circuit applying a second reference voltage to each of the plurality of second unit capacitors that is different from the first reference voltage.

20. The conversion method of claim 19, wherein the pull-up circuit comprises a first sampling switch configured to receive a first input signal, first and second reference voltage switches configured to receive the first control signal and apply first and second reference voltages, and a first successive-approximation-register (SAR) operation switch disposed between the first and second reference voltage switches, and when a sampling operation is performed, the first sampling switch is turned on by receiving a first sampling operation clock signal, the first SAR operation switch is turned off by receiving a first SAR clock signal, and the first reference voltage switch is turned off by receiving the first control signal such that the first input signal is sampled in each of the plurality of first unit capacitors, and when a conversion operation is performed, the first sampling switch is turned off, the first SAR operation switch is turned on by receiving a first SAR operation clock signal, and one of the first and second reference voltage switches is turned on by receiving the first control signal such that the first reference voltage is applied to each of the plurality of first unit capacitors.

21. The conversion method of claim 20, wherein the pull-down circuit comprises a second sampling switch configured to receive a second input signal, third and fourth reference voltage switches configured to receive the second control signal and apply first and second reference voltages, and a second SAR operation switch disposed between the third and fourth reference voltage switches, when a sampling operation is performed, the second sampling switch is turned on by receiving a second sampling operation clock signal, the second SAR operation switch is turned off by receiving a second SAR clock signal, and the fourth reference voltage switch is turned off by receiving the second control signal such that the second input signal is sampled in each of the plurality of second unit capacitors, and when a conversion operation is performed, the second sampling switch is turned off, the second SAR operation switch is turned on by receiving a second SAR operation clock signal, and one of the third and fourth reference voltage switches is turned on by receiving the second control signal such that the second reference voltage is applied to each of the plurality of second unit capacitors.

* * * * *